United States Patent
Akabane

(10) Patent No.: US 11,139,194 B2
(45) Date of Patent: Oct. 5, 2021

(54) SAMPLE HOLDER

(71) Applicant: KYOCERA Corporation, Kyoto (JP)

(72) Inventor: Kenichi Akabane, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 278 days.

(21) Appl. No.: 16/317,253

(22) PCT Filed: Jun. 30, 2017

(86) PCT No.: PCT/JP2017/024133
§ 371 (c)(1),
(2) Date: Jan. 11, 2019

(87) PCT Pub. No.: WO2018/020956
PCT Pub. Date: Feb. 1, 2018

(65) Prior Publication Data
US 2019/0259646 A1    Aug. 22, 2019

(30) Foreign Application Priority Data

Jul. 25, 2016    (JP) .............................. JP2016-145188

(51) Int. Cl.
*H01L 21/683* (2006.01)
*H01L 21/687* (2006.01)
(Continued)

(52) U.S. Cl.
CPC .... *H01L 21/6833* (2013.01); *H01L 21/67109* (2013.01); *H01L 21/683* (2013.01);
(Continued)

(58) Field of Classification Search
CPC ........... H01L 21/6833; H01L 21/67109; H01L 21/683; H01L 21/6831; H01L 21/6875; H01L 21/68757
See application file for complete search history.

(56) References Cited

U.S. PATENT DOCUMENTS 7,718,007 B2 *  5/2010  Oohashi ............ H01L 21/67109
                                                              118/728
2002/0176219 A1  11/2002  Sakaue et al.
(Continued)

FOREIGN PATENT DOCUMENTS

JP    2002-261157 A    9/2002
JP    2002-329775 A    11/2002
(Continued)

*Primary Examiner* — Thienvu V Tran
*Assistant Examiner* — Bart Iliya
(74) *Attorney, Agent, or Firm* — Volpe Koenig

(57) ABSTRACT

A sample holder includes: a ceramic body having a circular plate shape, the ceramic body comprising an upper surface serving as a sample holding face for holding a sample; and a suction electrode disposed within the ceramic body. The upper surface of the ceramic body includes a first circumferential wall portion having an annular shape, the first circumferential wall portion being constituted so as to protrude along an outer periphery of the ceramic body, and a plurality of projections formed in a region of the upper surface inside the first circumferential wall portion. Corners lying between an upper surface and side surfaces of the first circumferential wall portion are radiused. When viewed as a cross section of the ceramic body, a radius of curvature of an outside corner is smaller than a radius of curvature of an inside corner of the radiused corners of the first circumferential wall portion.

4 Claims, 5 Drawing Sheets

(51) Int. Cl.
*H01L 21/67* (2006.01)
*H02N 13/00* (2006.01)

(52) U.S. Cl.
CPC ...... *H01L 21/6831* (2013.01); *H01L 21/6875* (2013.01); *H01L 21/68757* (2013.01); *H02N 13/00* (2013.01)

(56) References Cited

U.S. PATENT DOCUMENTS

| | | |
|---|---|---|
| 2008/0037194 A1 | 2/2008 | Kamitani et al. |
| 2015/0146339 A1* | 5/2015 | Raj .................... H01L 21/6875 361/234 |
| 2016/0131981 A1* | 5/2016 | Shibuta .............. G03F 7/70716 355/30 |
| 2017/0140970 A1* | 5/2017 | Boyd, Jr. ............ H01L 21/6875 |

FOREIGN PATENT DOCUMENTS

| | | |
|---|---|---|
| JP | 2010-123843 A | 6/2010 |
| JP | 2012-216774 A | 11/2012 |
| KR | 10-2007-0032966 A | 3/2007 |

\* cited by examiner

SAMPLE HOLDER

TECHNICAL FIELD

The present invention relates to a sample holder used for holding a sample such as a semiconductor wafer in the process of manufacture of semiconductor integrated circuits, for example.

BACKGROUND ART

As a sample holder for use in a semiconductor manufacturing apparatus, etc., for example, there is known a sample holder described in Japanese Unexamined Patent Publication JP-A 2010-123843 (hereafter also referred to as Patent Literature 1). The sample holder described in Patent Literature 1 comprises: a ceramic body having an upper surface including a sample holding face; and a suction electrode disposed within the ceramic body. The upper surface of the ceramic body is provided with a plurality of projections and a circumferential wall portion disposed so as to surround the projections. The sample holder holds a sample on upper surfaces of the plurality of projections. An upper surface of the circumferential wall portion is brought into contact with the sample, and the circumferential wall portion has a ring-like shape so as to surround the plurality of projections. With this arrangement, a space inside the circumferential wall portion is closed by the circumferential wall portion and the sample. In the region inside the circumferential wall portion, gas used for cooling such as helium gas is fed to between the plurality of projections. This enables cooling of the sample when the sample is subjected to heat. An example in which heat is generated in the sample is, for example, a case where the sample is irradiated with plasma. Moreover, the sample holder is generally used in a vacuum environment, and thus, the outside of the circumferential wall portion is in a vacuum state.

SUMMARY OF INVENTION

A sample holder according to the present disclosure comprises: a ceramic body having a circular plate shape, the ceramic body comprising an upper surface serving as a sample holding face for holding a sample; and a suction electrode disposed within the ceramic body, the upper surface of the ceramic body comprising a first circumferential wall portion having an annular shape, the first circumferential wall portion being constituted so as to protrude along an outer periphery of the ceramic body, and a plurality of projections formed in a region of the upper surface inside the first circumferential wall portion, corners lying between an upper surface and side surfaces of the first circumferential wall portion being having radiused, in a cross section of the ceramic body taken along a plane passing through a center of the ceramic body in a plan view thereof, a radius of curvature of an outside corner of the corners radiused of the first circumferential wall portion being smaller than a radius of curvature of an inside corner of the corners radiused of the first circumferential wall portion.

DESCRIPTION OF EMBODIMENTS

The following describes a sample holder 10 with reference to the drawings.

Figure 1:
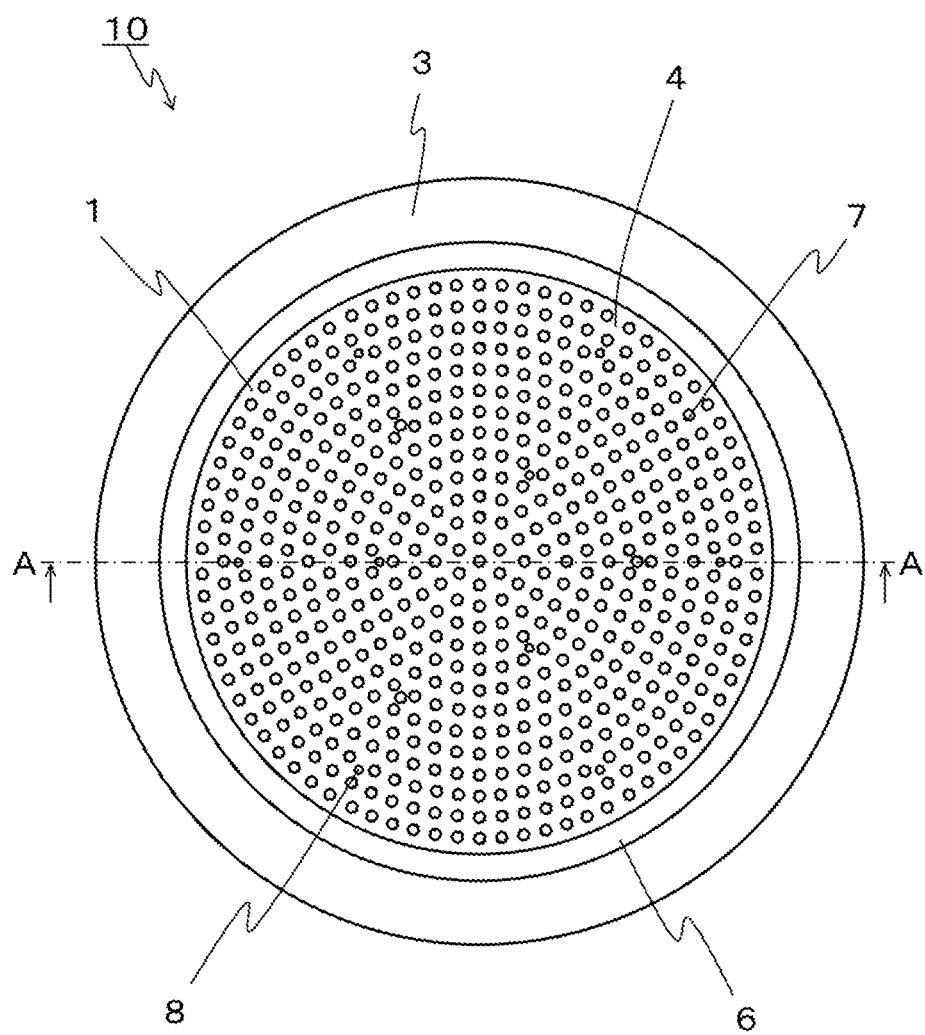
FIG. 1 is a top view showing a sample holder.
Figure 2:
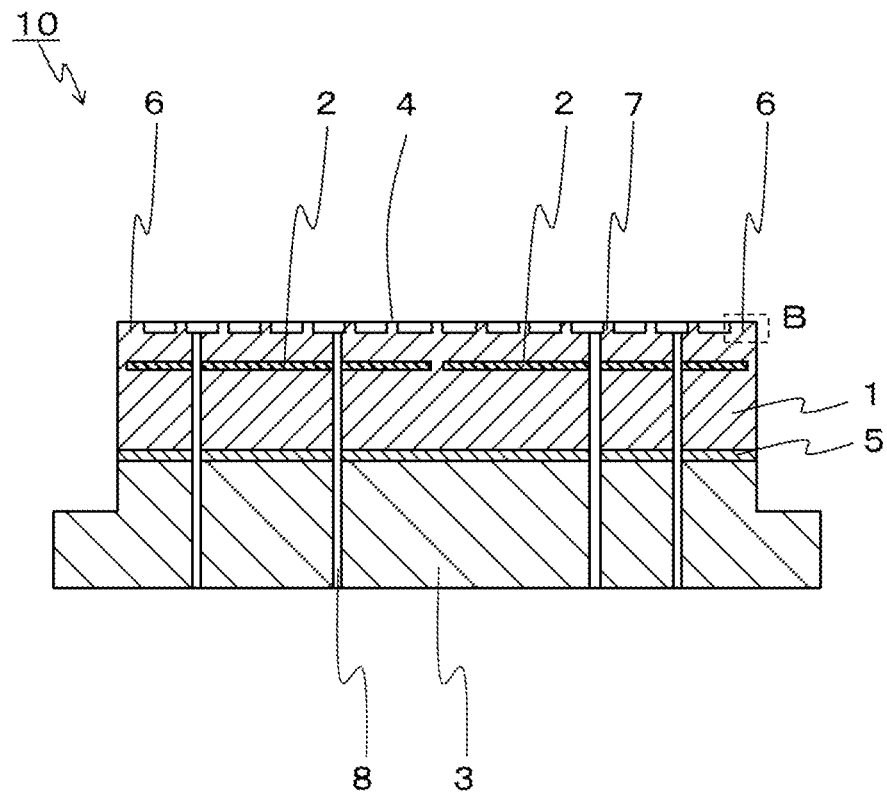
FIG. 2 is a cross-sectional view of the sample holder taken along the line A-A shown in FIG. 1.

As shown in FIGS. 1 and 2, the sample holder 10 comprises a ceramic body 1, a suction electrode 2, and a base plate 3.

The ceramic body 1 is a circular plate-shaped member having an upper surface serving as a sample holding face 4 for holding a sample. The ceramic body 1 holds a sample, for example, a silicon wafer, on the sample holding face 4. For example, the ceramic body 1 contains a ceramic material such as alumina, aluminum nitride, silicon nitride, or yttria. The dimensions of the ceramic body 1 can be set to 200 to 500 mm in diameter and 2 to 15 mm in thickness, for example.

While various ways may be adopted as a method for holding a sample with use of the ceramic body 1, the sample holder 10 of this example holds a sample by electrostatic force. The sample holder 10 thus comprises the suction electrode 2 located within the ceramic body 1. The suction electrode 2 is composed of two electrodes. One of the two electrodes is connected to the positive terminal of a power supply, and the other is connected to the negative terminal thereof. The two electrodes, each in the form of a substantially semicircular plate, are arranged within the ceramic body 1 so that chords of semicircles are opposed to each other. These two electrodes are joined together so that the outer shape of the entire suction electrode 2 is circular. The center of the circle defining the outer shape of the entire suction electrode 2 is set to coincide with the center of a circle defining the entire outer shape of the ceramic body 1. For example, the suction electrode 2 contains a metal material such as platinum, tungsten, or molybdenum.

The base plate 3 is a support member for the ceramic body 1. For example, the base plate 3 is constructed of a circular plate-shaped member. For example, the base plate 3 contains a metal material. As the metal material, for example, aluminum may be used. The base plate 3 and the ceramic body 1 are joined together via an adhesive layer 5, for example. As the adhesive layer 5, for example, a silicone adhesive may be used.

The upper surface of the ceramic body 1 is provided with a first circumferential wall portion 6 and projections 7 located in a region inside the first circumferential wall portion 6. Moreover, the ceramic body 1 is provided with a plurality of gas vents 8, through which cooling gas is introduced to the upper surface of the ceramic body 1. The gas vent 8 penetrates the ceramic body 1, as well as the adhesive layer 5 and the base plate 3 located below the ceramic body 1.

The first circumferential wall portion 6 is disposed so as to protrude on the upper surface of the ceramic body 1 along the outer periphery of the ceramic body 1. The first circumferential wall portion 6 can seal the region inside the first circumferential wall portion 6 in conjunction with a sample.

The first circumferential wall portion 6 is annular-shaped as seen in a top view. More specifically, the first circumferential wall portion 6 has a circular inner periphery and a circular outer periphery. When viewed in cross section, the first circumferential wall portion 6 is rectangular-shaped, and corners lying between the upper surface and the side surfaces of the first circumferential wall portion 6 are radiused. More specifically, a corner defined by the upper surface and the inner periphery of the first circumferential wall portion 6 and a corner defined by the upper surface and the outer periphery thereof are each radiused. This makes it possible to reduce the likelihood that, when a sample is held in contact with the upper surface of the first circumferential wall portion 6, the corners of the first circumferential wall portion 6 will sustain damage such as chipping due to a contact with the sample.

The plurality of projections 7 are located in the region inside the first circumferential wall portion 6. The plurality of projections 7 are provided for holding a sample. The plurality of projections 7 protrude in a direction perpendicular to the upper surface. The plurality of projections 7 are dispersed over the entire area of the region inside the first circumferential wall portion 6. For example, the plurality of projections 7 are each constructed of a cylindrical member. When viewed in cross section, the plurality of projections 7 are each rectangular-shaped, and corners lying between the upper surface and the side surfaces thereof are radiused. The dimensions of each of the plurality of projections 7 can be set to 0.5 to 1.5 mm in diameter and 5 to 15 µm in height, for example.

The plurality of projections 7 and the first circumferential wall portion 6 may be formed by the following method, for example. More specifically, after a blast mask is stuck to or formed on the upper surface of the ceramic body 1, blast finishing is performed thereon. This makes it possible to form projecting portions which become the plurality of projections 7 and the first circumferential wall portion 6 on the upper surface. The projecting portions are each machined to have radiused corners by a lapping machine or a brush-polishing machine. In this way, the plurality of projections 7 and the first circumferential wall portion 6 can be formed.

Figure 3:
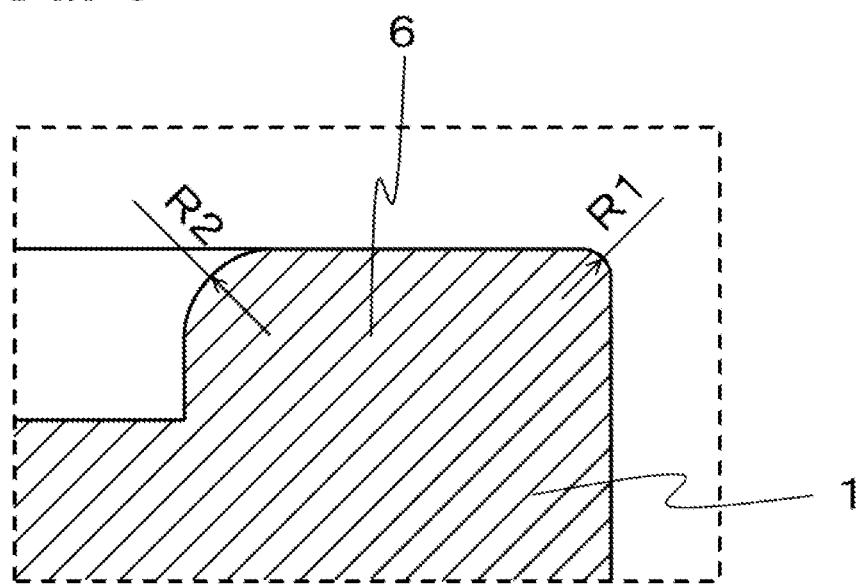
FIG. 3 is a fragmentary cross-sectional view showing a region B of the sample holder shown in FIG. 2 in enlarged dimension.

As shown in FIG. 3, in the sample holder 10 as viewed in cross section, a radius of curvature R1 of the outside corner of the corners radiused of the first sealing area is smaller than a radius of curvature R2 of the inside corner of the corners radiused of the first sealing area. In other words, the radius of curvature of the corner defined by the upper surface and the outer circumferential surface is smaller than the radius of curvature of the corner defined by the upper surface and the inner circumferential surface. The cross section corresponds to a cross section taken along the plane passing through the center of the ceramic body 1 in a plan view thereof. This makes it possible to improve uniformity in heat application to a sample. More specifically, by making a radius of curvature of the inside corner of the corners radiused larger, it is possible to cause cooling gas to be present in part of the region between the first circumferential wall portion 6 and the sample. Moreover, by making a radius of curvature of the outside corner of the corners radiused smaller, it is possible to reduce a space (vacuum space) formed between the first circumferential wall portion 6 and the sample.

The dimensions of the first circumferential wall portion 6 can be set to 240 to 260 mm in inner periphery diameter, 290 to 310 mm in outer periphery diameter, and 6 to 15 µm in thickness, for example. For example, the radius of curvature of the corner defined by the upper surface and the inner circumferential surface of the first circumferential wall portion 6 can be set to 3 to 15 µm, and the radius of curvature of the corner defined by the upper surface and the outer circumferential surface of the first circumferential wall portion 6 can be set to 2 to 5 µm.

Figure 4:
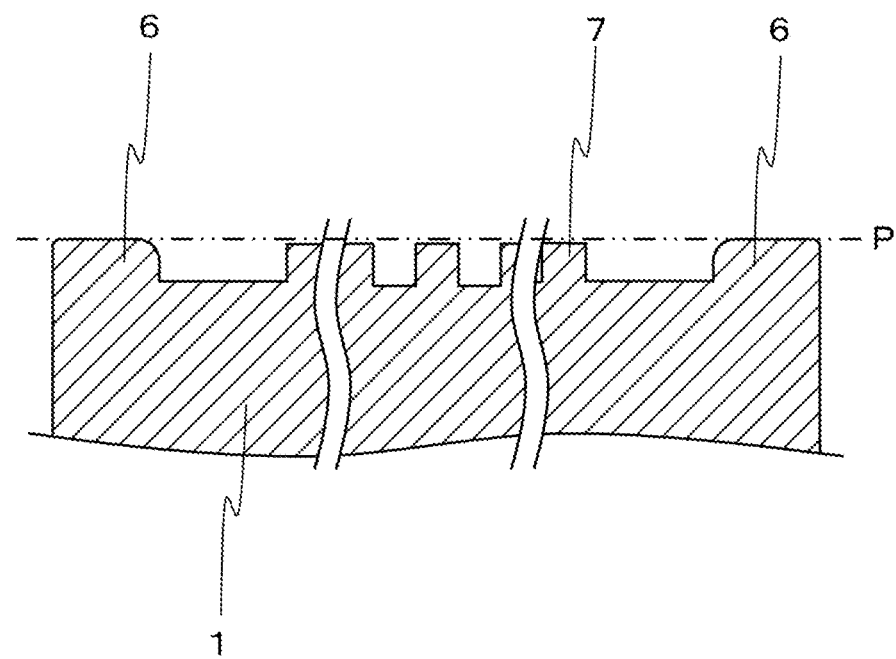
FIG. 4 is a cross-sectional view showing another sample holder.

Moreover, as shown in FIG. 4, heights of the plurality of projections 7 may be lower than a height of the first circumferential wall portion 6. In this case, when a sample is deflected downwardly at a midportion thereof due to suction caused by the suction electrode 2, the sample can be supported at a plurality of positions by the first circumferential wall portion 6 and the plurality of projections 7. This makes it possible to reduce particle detachment which occurs in the surface of the sample holder 10 or the sample due to concentration of force on a certain area of the sample holder 10 or the sample. As employed herein "the height of the projection 7" indicates the length from a region of the upper surface of the ceramic body 1 which region lies inside the first circumferential wall portion 6 and is free of the plurality of projections 7 and the first circumferential wall portion 6, to the top of the projection 7. As employed herein "the length" indicates the length of the projection in a direction perpendicular to the upper surface of the ceramic body 1. At this time, the heights of the plurality of projections 7 can be lower than the height of the first circumferential wall portion 6 by about 2 to 5 µm.

In the case where it is difficult to measure the height of the plurality of projections 7 and the height of the first circumferential wall portion 6, it is possible to ascertain that the heights of the plurality of projections 7 are lower than the height of the first circumferential wall portion 6 in the following manner, for example. More specifically, as shown in FIG. 4, the projection is determined to have a lower height when the upper surface of the first circumferential wall portion 6 is located below the level of an imaginary plane P including the upper surface of the first circumferential wall portion 6.

Figure 5:
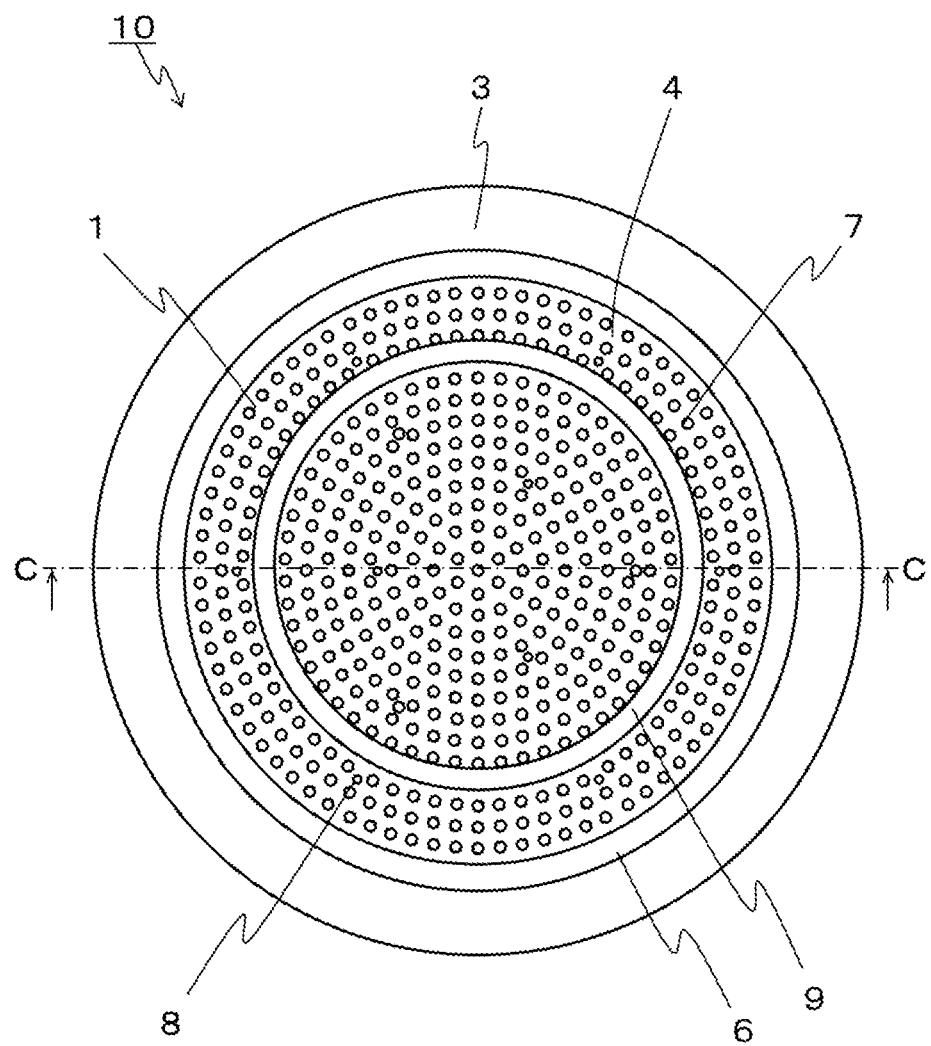
FIG. 5 is a top view showing another sample holder.
Figure 6:
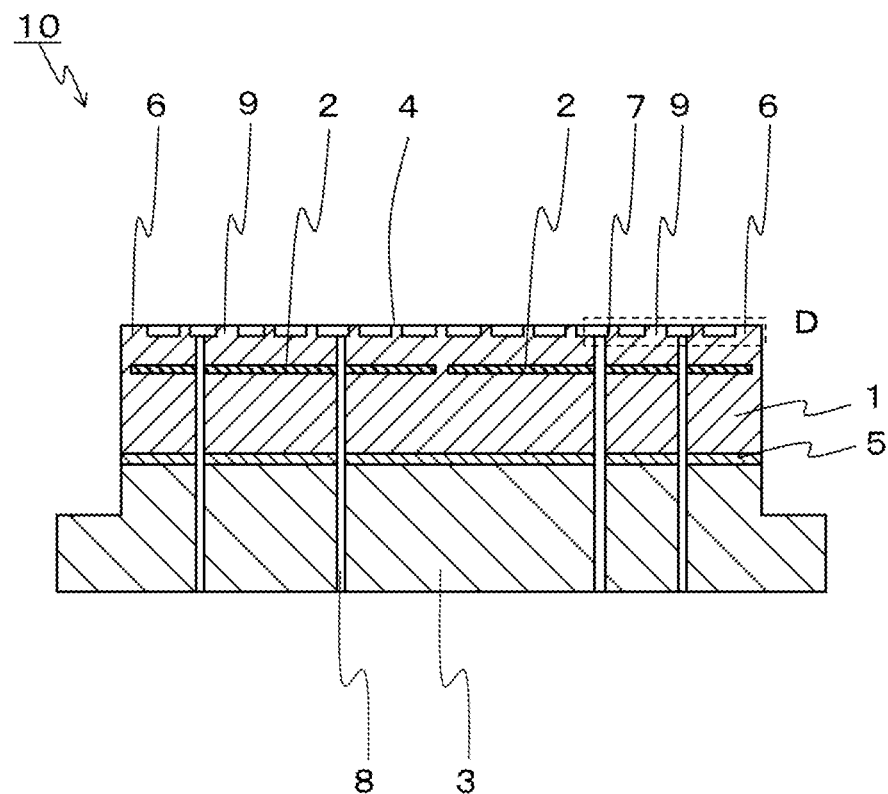
FIG. 6 is a cross-sectional view of the sample holder taken along the line C-C shown in FIG. 5.

Moreover, as shown in FIGS. 5 and 6, the upper surface of the ceramic body 1 may be provided with a second circumferential wall portion 9 which has an annular shape and is spaced inwardly from the first circumferential wall portion 6. The placement of the second circumferential wall portion 9 makes it possible to partition the space into a region inside the second circumferential wall portion 9 and a region outside the second circumferential wall portion 9, and therefore the flow rate of the cooling gas can be changed between the inside region and the outside region of the second circumferential wall portion 9. This makes it possible to perform more accurate temperature control, and therefore improve uniformity in heat application to the sample.

Figure 7:
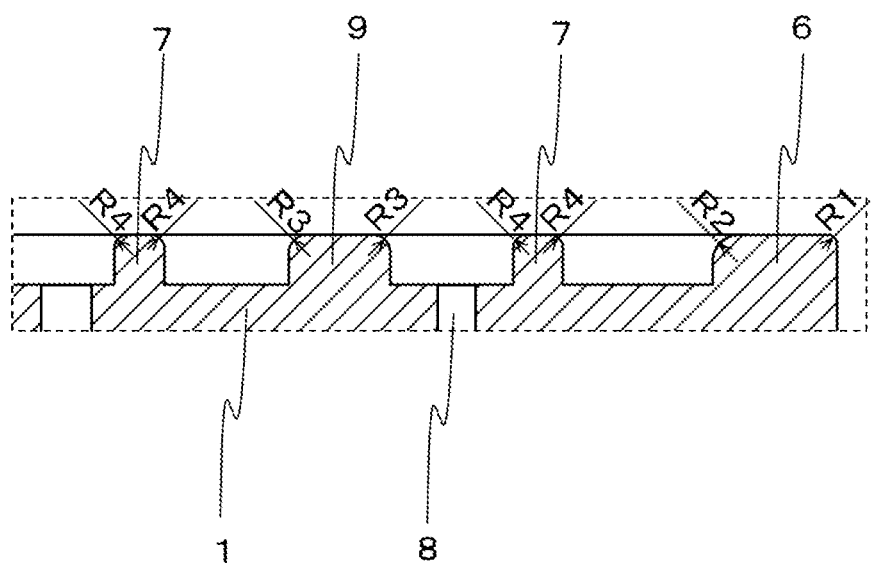
FIG. 7 is a fragmentary cross-sectional view showing a region D of the sample holder shown in FIG. 6 in enlarged dimension.

As shown in FIG. 7, when viewed in cross section, corners lying between the upper surface and the side surfaces of the second circumferential wall portion 9 may be radiused, and, a radius of curvature R3 of the radiused corner of the second circumferential wall portion 9 may be greater than the radius of curvature R1 of the outside corner of the corners radiused of the first circumferential wall portion 6. According to this, cooling gas is supplied to a region between the second sealing area and the sample, and therefore uniformity in heat application can be further improved. The radius of curvature of the radiused corner of the second circumferential wall portion 9 can be set to 5 to 10 µm, for example. In FIG. 7, the second circumferential wall portion 9 has two radiused corners on an outer periphery side and an inner periphery side. In determining the radius of curvature R3 of the radiused corner of the second circumferential wall portion 9, either one of the outer periphery-side radiused corner and the inner periphery-side radiused corner of the second circumferential wall portion 9 may be subjected to measurement.

Moreover, when viewed in cross section, corners lying between the upper surface and the side surfaces of each of the plurality of projections 7 may be radiused, and, a radius of curvature R4 of each of the radiused corners of each of the plurality of projections 7 may be greater than the radius of curvature R1 of the outside corner of the corners radiused of the first circumferential wall portion 6. According to this, cooling gas is supplied to a region between the upper surface of each of the plurality of projections 7 and the sample, and therefore uniformity in heat application can be further improved. In FIG. 7, the projection 7 has two radiused corners on an outer periphery side and an inner periphery side. In determining the radius of curvature R4 of the radiused corner of the projection 7, either one of the outer periphery-side radiused corner and the inner periphery-side radiused corner of the projection 7 may be subjected to measurement.

Moreover, a surface roughness of the upper surface of each of the plurality of projections 7 may be greater than a surface roughness of the upper surface of the first circumferential wall portion 6. This makes it possible to facilitate removal of a sample from the plurality of projections 7 by which the sample is held under suction while sealing is achieved at the first circumferential wall portion 6. The surface roughness of the upper surface of the projection 7 can be set to 0.15 to 0.25 μm in terms of Ra, for example. The surface roughness of the upper surface of the first circumferential wall portion 6 can be set to 0.05 to 0.15 μm in terms of Ra, for example.

REFERENCE SIGNS LIST

1: Ceramic body
2: Suction electrode
3: Base plate
4: Sample holding face
5: Adhesive layer
6: First circumferential wall portion
7: Projection
8: Gas vent
9: Second circumferential wall portion
10: Sample holder

The invention claimed is:

1. A sample holder, comprising:

a ceramic body having a circular plate shape, the ceramic body comprising an upper surface serving as a sample holding face for holding a sample, the upper surface of the ceramic body comprising a first circumferential wall portion having an annular shape, the first circumferential wall portion being constituted so as to protrude along an outer periphery of the ceramic body, and a plurality of projections formed in a region of the upper surface inside the first circumferential wall portion, wherein corners lying between an upper surface and side surfaces of the first circumferential wall portion are radiused, and when viewed as a cross section of the ceramic body taken along a plane passing through a center of the ceramic body in a plan view thereof, a radius of curvature of an outside corner is smaller than a radius of curvature of an inside corner of the radiused corners of the first circumferential wall portion; and a suction electrode disposed within the ceramic body, wherein the upper surface of the ceramic body comprises a second circumferential wall portion which has an annular shape and is spaced inwardly from the first circumferential wall portion, corners lying between an upper surface and side surfaces of the second circumferential wall portion are radiused, and a radius of curvature of each of the radiused corners of the second circumferential wall portion is greater than the radius of curvature of the outside corner of the radiused corners of the first circumferential wall portion.

2. The sample holder according to claim 1, wherein heights of the plurality of projections are lower than a height of the first circumferential wall portion.

3. The sample holder according to claim 1, wherein corners lying between an upper surface and side surfaces of each of the plurality of projections are radiused, and a radius of curvature of each of the radiused corners of each of the plurality of projections is greater than the radius of curvature of the outside corner of the radiused corners of the first circumferential wall portion.

4. The sample holder according to claim 1, wherein a surface roughness of an upper surface of each of the plurality of projections is greater than a surface roughness of the upper surface of the first circumferential wall portion.

* * * * *